United States Patent [19]
Okuda et al.

[11] Patent Number: 5,379,514
[45] Date of Patent: Jan. 10, 1995

[54] ELECTRONIC COMPONENT INSTALLING APPARATUS AND METHOD

[75] Inventors: Osamu Okuda, Hirakata; Minoru Yamamoto, Ashiya; Tomoyuki Nakano, Osaka; Wataru Hirai, Hirakata, all of Japan

[73] Assignee: Matsushita Electric Industrial Co., Ltd., Osaka, Japan

[21] Appl. No.: 153,095

[22] Filed: Nov. 17, 1993

[30] Foreign Application Priority Data

Nov. 19, 1992 [JP] Japan ................................. 4-309974

[51] Int. Cl.⁶ ......................... H05K 3/30; B23P 19/00
[52] U.S. Cl. ......................................... 29/833; 29/740
[58] Field of Search ............... 29/833, 721, 840, 740, 29/834, 720, 846

[56] References Cited

U.S. PATENT DOCUMENTS

| | | | |
|---|---|---|---|
| 4,738,025 | 4/1988 | Arnold | 29/833 X |
| 4,979,290 | 12/1990 | Chiba | 29/840 |
| 4,980,971 | 1/1991 | Bartschat et al. | 29/833 |
| 5,084,962 | 2/1992 | Takahashi et al. | 29/833 |
| 5,233,745 | 8/1993 | Morita | 29/833 X |

*Primary Examiner*—Carl J. Arbes
*Attorney, Agent, or Firm*—Wenderoth, Lind & Ponack

[57] ABSTRACT

An electronic component installing apparatus includes a transporting unit for transporting an electronic circuit board to the apparatus at a predetermined position thereof and transporting the electronic circuit board therefrom, a head, having a suction nozzle, for drawing thereto an electronic component placed on an electronic component supply unit and installing the electronic component on the electronic circuit board, a device for placing the head at a given position along an X-axis and a Y-axis, and an optical signal transmitting-/receiving device. The optical signal transmitting-/receiving device includes first and second optical signal transmitting/receiving units for transmitting-/receiving optical signals between the first and second units so as to control operation of the apparatus. The first unit is disposed at the head, and the second unit is disposed at a fixed section of the device.

8 Claims, 3 Drawing Sheets

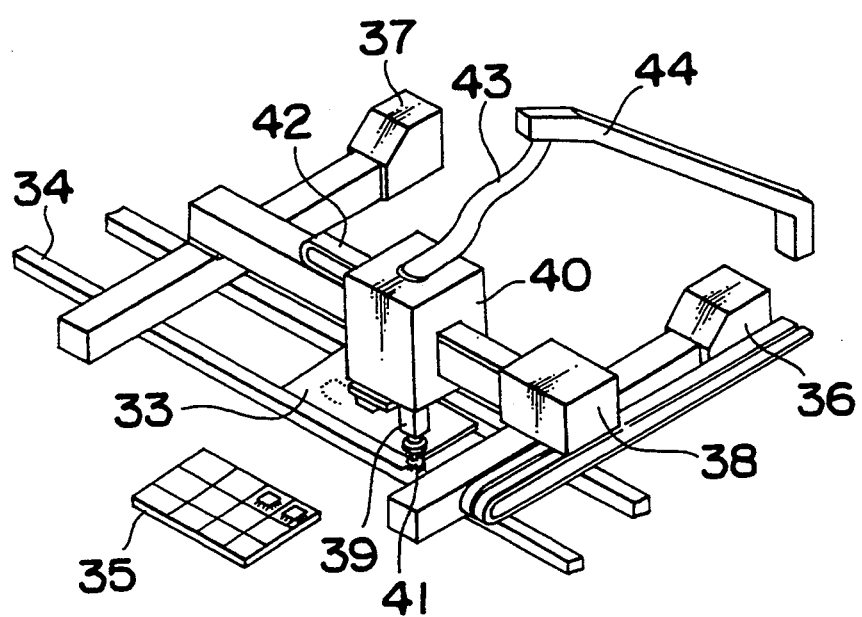
Fig. 4 - PRIOR ART

ELECTRONIC COMPONENT INSTALLING APPARATUS AND METHOD

BACKGROUND OF THE INVENTION

The present invention relates to an electronic component installing apparatus and a method for installing an electronic component on an electronic circuit board.

In recent years, there has been a growing demand for the development of techniques for accurately installing electronic components on an electronic circuit board at a predetermined position thereof. An example of a conventional electronic component installing apparatus is described below with reference to FIG. 4. The apparatus comprises a transporting unit 34 for transporting an electronic circuit board 33 to a predetermined position thereof and transporting it therefrom; Y-robots 36 and 37 and an X-robot 38 for positioning, at a given position, a head 40 including a suction nozzle 39 for drawing thereto an electronic component 41 placed on an electronic component supply unit 35; a cable 42 accommodating power lines for supplying electric power to a driving portion of the head 40; a cable 43 accommodating signal lines for sending signals to a sensor disposed inside the head 40; and a frame 44 for hanging the cable 43.

The operation of the electronic component installing apparatus is described below. The Y-robots 36 and 37 and the X-robot 38 move the head 40 to a location disposed above the electronic component supply unit 35. Then, the suction nozzle 39 moves downward, thus drawing the electronic component 41 thereto. A recognizing camera provided in the head 40 images the position and posture of the electronic component 41 drawn by the suction nozzle 39 being moved to the electronic circuit board 33. Based on the information provided by the camera, the electronic component 41 on the suction nozzle 39 is corrected in its position and posture and then, installed on the electronic circuit board 33.

The construction of the above-described electronic component installing apparatus has, however, the following disadvantages. Signal lines are liable to be affected by noises generated by the cable 42 due to a high voltage and frequency of the power lines accommodated therein. Therefore, in the conventional electronic component installing apparatus, it is necessary to dispose the power lines and the signal lines separately from each other in order to stabilize the operation thereof. To this end, the signal lines are accommodated in the cable 43. Consequently, the frame 44 is required to hang the cable 43, which increases the manufacturing cost. In addition, as countermeasures against noise, normally, the signal line comprises a twisted pair. Accordingly, the diameter of the signal line is great and it is difficult to bend it, and thus the signal line is liable to be broken. Signal lines are increasingly provided in the component installing apparatus because the head is required to detect the number of electronic components in addition to imaging the position and posture thereof.

SUMMARY OF THE INVENTION

It is therefore an object of the present invention to provide a compact electronic component installing apparatus.

It is another object of the present invention to provide an electronic component installing apparatus resistant to noises.

It is still another object of the present invention to provide an electronic component installing apparatus and a method in which signal lines are not broken and mechanical oscillation is reduced.

In accomplishing these and other objects, according to a first aspect of the present invention, there is provided an electronic component installing apparatus comprising: a transporting unit for transporting an electronic circuit board to the apparatus at a predetermined position thereof and transporting the electronic circuit board therefrom; a head, having a suction nozzle, for drawing thereto an electronic component placed on an electronic component supply unit and installing the electronic component on the electronic circuit board; a device for placing the head at a given position along an X-axis and a Y-axis; and an optical signal transmitting-/receiving device including first and second optical signal transmitting/receiving units for transmitting-/receiving optical signals between the first and second units so as to control operation of the apparatus, the first unit disposed at the head and the second unit disposed at a fixed section of the device.

According to a second aspect of the present invention, there is provided a method for installing an electronic component by using an electronic component installing apparatus, the apparatus comprising: a transporting unit for transporting an electronic circuit board to the apparatus at a predetermined position thereof and transporting the electronic circuit board therefrom; a head, having a suction nozzle, for drawing thereto an electronic component placed on an electronic component supply unit and installing the electronic component on the electronic circuit board; and a device for placing the head at a given position along an X-axis and a Y-axis, the method comprising the step of transmitting-/receiving optical signals by first and second optical signal transmitting/receiving units so as to control operation of the apparatus, the first unit disposed at the head, and the second unit disposed at a fixed section of the device.

BRIEF DESCRIPTION OF THE DRAWINGS

These and other objects and features of the present invention will become clear from the following description taken in conjunction with the preferred embodiments thereof with reference to the accompanying drawings, in which:

FIG. 4 is a perspective view showing an entire conventional electronic component installing apparatus.

DETAILED DESCRIPTION OF THE INVENTION

Figure 1:
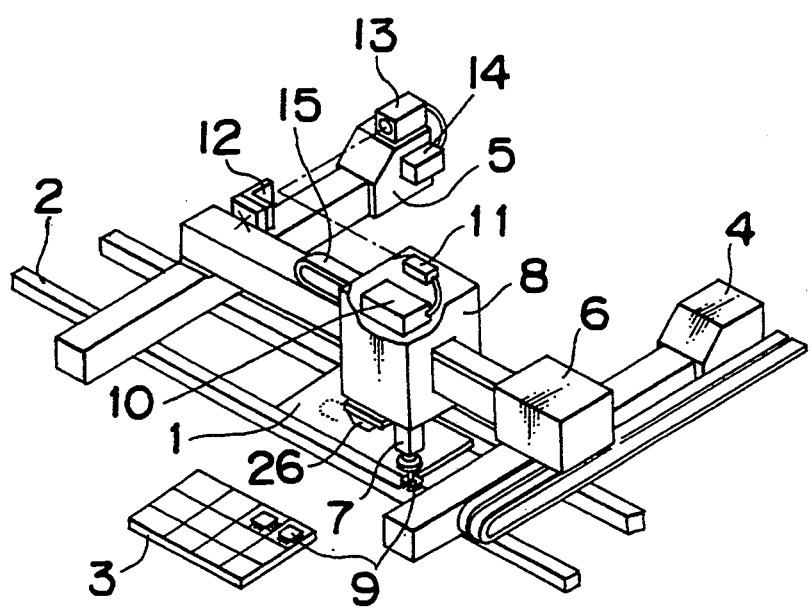
FIG. 1 is a perspective view showing an entire electronic component installing apparatus according to an embodiment of the present invention.

Before the description of the present invention proceeds, it is to be noted that like parts are designated by like reference numerals throughout the accompanying drawings.

An electronic component installing apparatus according to an embodiment is described below with reference to FIGS. 1 through 3. Referring to FIG. 1, the electronic component installing apparatus comprises a transporting unit 2 for transporting an electronic circuit board 1 to a predetermined position thereof and transporting it therefrom; Y-robots 4 and 5 and an X-robot 6 for positioning, at a given position, a head 8 including a suction nozzle 7 for drawing thereto an electronic component 9 placed on an electronic component supply unit 3; a cable 15 accommodating power lines for supplying electric power to a driving portion of the head 8; and a head amplifier 10 for sending-/receiving signals from various devices disposed inside the head 8 as shown in FIG. 2.

Figure 2:
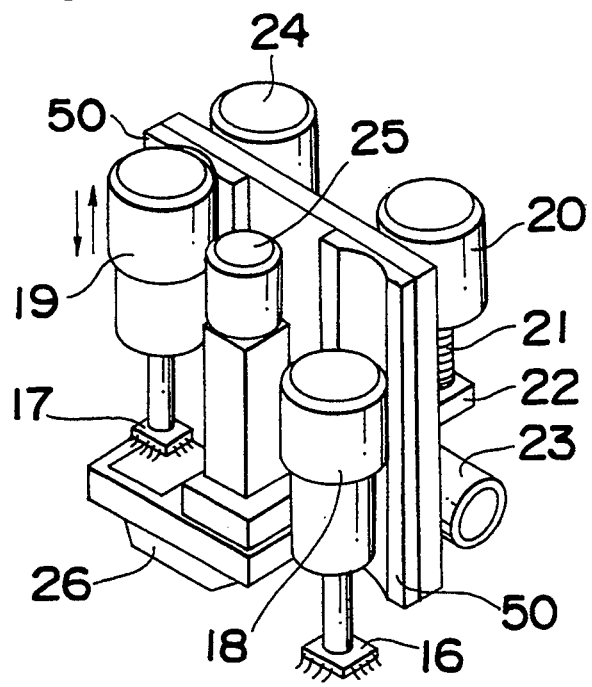
FIG. 2 is a perspective view showing a head of the electronic component installing apparatus of FIG. 1 in detail.

FIG. 2 shows details of the head 8 which accommodates two suction nozzles 18 and 19 each serving as the suction nozzle 7 so as to draw electronic components 16 and 17, respectively. The suction nozzle 18, for drawing an electronic component 16 thereto, is moved upward and downward by a motor 20 via a ball thread 21 and a nut 22. The suction nozzle 19, for drawing an electronic component 17 thereto, is moved upward and downward by a motor 24 via a ball thread and a nut (not shown). Also accommodated by the head 8 is a mirror box 26, which is driven by a motor 23, for sending the images of the electronic components 16 and 17 to a recognizing camera 25. The nut 22 being driven by the motor 20 is connected to the suction nozzle 18 and thus the nut 22 moves together with the suction nozzle 18 upward and downward while being guiding by a guide member 50 having a curved recess corresponding to the configuration of the suction nozzle 18. Since the suction nozzle 19 has a construction similar to the suction nozzle 18, the suction nozzle 19 moves together with the nut (not shown) being driven by the motor 24. The mirror box 26 is moved by the motor 23 between positions below the suction nozzles 18 and 19. That is, when the suction nozzle 19 holding the component 17 is moved upward, the mirror box 26 is moved to the position below the suction nozzle 19 so that the camera 25 can pick up the image of the component 17 held by the suction nozzle 19 via the mirror box 26. When the suction nozzle 18 holding the component 17 is moved upward, the mirror box 26 is moved to the position below the suction nozzle 18 so that the camera 25 can pick up the image of the component 17 held by the suction nozzle 18 via the mirror box 26.

The operation of the electronic component installing apparatus is described below. The electronic circuit board 1 is transported by the transporting unit 2 to an electronic component installing position. The X-robot 6 and the Y-robots 4 and 5 move the head 8 to a location above the electronic component supply unit 3. Then, the suction nozzle 19 moves downward, thus drawing the electronic component 17 thereto. Then, the suction nozzle 19 is moved upward by the motor 24, and the motor 23 moves the mirror box 26 to a position below the suction nozzle 19. The recognizing camera 25 picks up an image of the position and posture of the electronic component 17 held by the suction nozzle 19. Based on the information provided by the camera 25, the electronic component 17 held by the suction nozzle 19 is corrected in its position and posture and then, moved and installed on the electronic circuit board 1 by downward movement of the suction nozzle 19.

Figure 3:
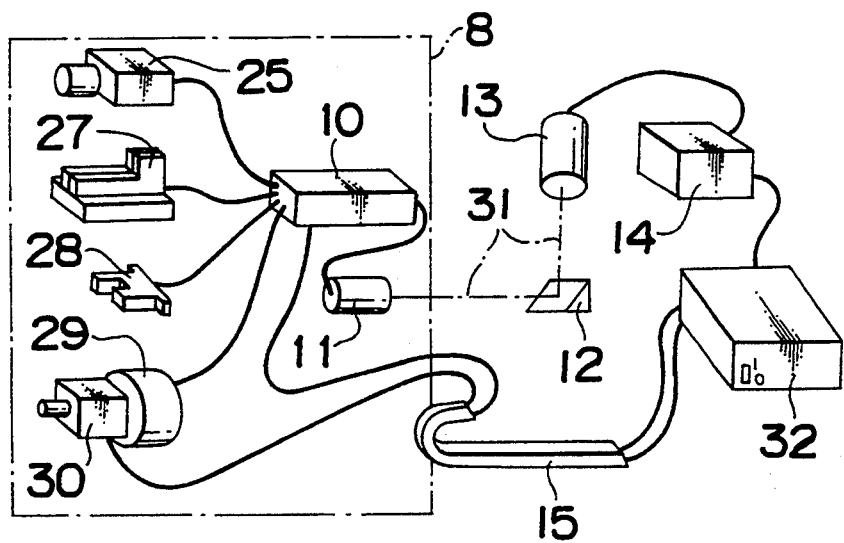
FIG. 3 is a block diagram showing transmission of optical signals between the head and a controller.

FIG. 3 shows a schematic model of the head 8 for describing the transmission of optical signals between the head 8 and a controller 32. The head 8 accommodates the camera 25, and a valve 27 for switching between suction and non-suction of the suction nozzles in accordance with the vertical positions of the suction nozzles 18 and 19. The valve 27 is operatively connected with a sensor for detecting the presence of the components at the suction nozzles by detecting the vacuum degrees thereof. The motors 20, 24, and 23 for driving the suction nozzles 18 and 19 and the mirror box 26 are operatively connected with sensors 28 for setting the original position and operational range of each of the suction nozzles 18 and 19 and the mirror box 26 and setting the interlocking operation of each axis. Each of the motors 20, 24, and 23 includes a motor main body 30 and is operatively connected with an encoder 29. In the electronic component installing apparatus, the head amplifier 10 receives signals outputted from the camera 25, the valve 27, the sensors 28, and the encoder 29. A laser oscillation transmitting/receiving device 11 outputs serial signals 31 as optical signals to a laser oscillation transmitting/receiving device 13 via a reflection mirror 12 and vice versa. That is, the mirror 12 reflects laser beams emitted from one to the other of the laser oscillation transmitting/receiving devices 11 and 13 and vice versa. The fixed side-amplifier 14 connected to the device 13 decodes the serial signals 31, thus outputting the decoded signals to the controller 32. More specifically, the controller 32 receives signals indicating the information of the positions and postures of the electronic components held by the suction nozzles 18 and 19 from the camera 25; a signal indicating the information, from the valve 27, as to whether or not the electronic components have been drawn to the suction nozzles 18 and 19; the interlocking information of each shaft from the sensors 28; and the information of the vertical movement of the suction nozzles 18 and 19. The controller 32 outputs control signals to these elements 25, 27, 28, 18, and 19. The controller 32 also receives signals, via the cable 15, indicating the information of a power supply to a power line connected with the motor main body 30 and the information of a power supply to the head amplifier 10 and the information of an air pipe (not shown) providing a vacuum of a certain degree. That is, the power lines and the signal lines are disposed appropriately so that the signal lines are not affected by noises generated by the power lines. In addition, it is unnecessary to install a frame for hanging the cable accommodating the signal lines. Therefore, a compact apparatus can be manufactured.

According to the above construction, optical signals indicating the vertical movement of the suction nozzle disposed inside the head and the information of an inspected electronic component are transmitted between the transmitting/receiving unit disposed inside the head and the transmitting/receiving unit disposed in the fixed section. The power lines and the signal lines are disposed appropriately so that the signal lines are not affected by noises and mechanical oscillation generated by the power lines. Accordingly, the electronic component can be accurately installed on the electronic circuit board. In addition, it is unnecessary to install a frame for hanging the cable accommodating the signal lines. Therefore, a compact apparatus can be manufactured.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

We claim:

1. A method for installing an electronic component on an electronic component circuit board, comprising the steps of:

operating an electronic circuit board transporting unit to transport an electronic circuit board to and from a predetermined position;

mounting a head positioning device, including a fixed portion, adjacent said transporting unit;

mounting a head to said head positioning device for movement relative to said fixed portion thereof, said head including a suction nozzle for creating a suction force to draw thereto and hold an electronic component;

operating said head positioning device to move said head along X and Y axes relative to said fixed portion and said transporting unit and to position said head at a given position along said X and Y axes;

mounting a detection means to one of said head and said fixed portion, and operating said detection means to detect positional information for at least one of the electronic component and said suction nozzle; and mounting a controller, operable to control operation of said head and said suction nozzle, to the other of said head and said fixed portion; and optically transmitting/receiving control signals between said detection means and said controller by operating a first optical signal transmitting/receiving unit mounted to said head for movement with said head and a second optical signal transmitting/receiving unit mounted to said fixed portion of said head positioning device.

2. A method as recited in claim 1, wherein in optically transmitting/receiving the control signals, one of said first and second optical signal transmitting/receiving units is operated for transmitting/receiving a laser beam along the X-axis, and the other of said first and second optical signal transmitting/receiving units is operated for transmitting/receiving a laser beam along the Y-axis.

3. A method as recited in claim 2, further comprising mounting a reflection mirror to said head positioning device to reflect a laser beam transmitted from one of said first and second optical signal transmitting/receiving units toward the other of said first and second optical signal transmitting/receiving units.

4. A method as recited in claim 1, further comprising vertically moving said suction nozzle relative to said head positioning device; and wherein said step of optically transmitting/receiving the control signals comprises optically transmitting/receiving a signal indicating vertical movement of said suction nozzle relative to said head positioning device, a signal indicating whether said suction nozzle is creating the suction force, a signal indicating whether the electronic component is being held by said suction nozzle, and a signal indicating an orientation of the electronic component when held by said suction nozzle.

5. An electronic component installing apparatus comprising:

an electronic circuit board transporting unit for transporting an electronic circuit board to and from a predetermined position;

a head positioning device including a fixed portion and being mounted adjacent said transporting unit;

a head mounted to said head positioning device for movement relative to said fixed portion thereof, said head including a suction nozzle for creating a suction force to draw thereto and hold an electronic component;

said head positioning device constituting a means for moving said head along X and Y-axes relative to said fixed portion and said transporting unit and for positioning said head at a given position along said X and Y-axes;

a detection means, mounted to one of said head and said fixed portion, for detecting positional information for at least one of the electronic component and said suction nozzle; and a controller, mounted to the other of said head and said fixed portion, for controlling operation of said head and said suction nozzle; and an optical signal transmitting/receiving device, including a first optical signal transmitting/receiving unit mounted to said head for movement with said head and a second optical signal transmitting/receiving unit mounted to said fixed portion of said head positioning device, for optically transmitting/receiving control signals between said detection means and said controller.

6. An electronic component installing apparatus as recited in claim 5, wherein one of said first and second optical signal transmitting/receiving units comprises a means for transmitting/receiving a laser beam along the X-axis, and the other of said first and second optical signal transmitting/receiving units comprises a means for transmitting/receiving a laser beam along the Y-axis.

7. An electronic component installing apparatus as recited in claim 6, wherein said optical signal transmitting/receiving device further includes a reflection mirror mounted to said head positioning device for reflecting a laser beam transmitted from one of said first and second optical signal transmitting/receiving units toward the other of said first and second optical signal transmitting/receiving units.

8. An electronic component installing apparatus as recited in claim 5, wherein said head includes means for vertically moving said suction nozzle relative to said head positioning device;

said control signals include a signal indicating vertical movement of said suction nozzle relative to said head positioning device, a signal indicating whether said suction nozzle is creating the suction force, a signal indicating whether the electronic component is being held by said suction nozzle, and a signal indicating an orientation of the electronic component when held by said suction nozzle.

* * * * *